US006570483B1

(12) United States Patent
Chandler et al.

(10) Patent No.: US 6,570,483 B1
(45) Date of Patent: *May 27, 2003

(54) ELECTRICALLY RESISTIVE PTC DEVICES CONTAINING CONDUCTIVE POLYMERS

(75) Inventors: Daniel A. Chandler, Menlo Park, CA (US); Martin Matthiesen, Fremont, CA (US); Derek Leong, Foster City, CA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/816,471

(22) Filed: Mar. 13, 1997

Related U.S. Application Data

(63) Continuation of application No. 08/672,496, filed on Jun. 28, 1996, now abandoned, which is a continuation of application No. 08/255,584, filed on Jun. 8, 1994, now abandoned.

(51) Int. Cl.[7] .................... H01L 7/10

(52) U.S. Cl. .................... 338/22 R; 338/324; 338/328

(58) Field of Search .................... 338/22 R, 225 D, 338/309, 312, 314, 322, 324, 327, 328; 427/102, 103

(56) References Cited

U.S. PATENT DOCUMENTS

| | | | | |
|---|---|---|---|---|
| 3,237,286 A | * | 3/1966 | Ebling et al. | 29/619 |
| 3,344,316 A | * | 9/1967 | Stelmark | 361/773 |
| 3,351,882 A | * | 11/1967 | Kohler et al. | 338/322 |
| 4,103,274 A | * | 7/1978 | Burgess et al. | 338/21 |
| 4,237,441 A | | 12/1980 | van Konynenburg et al. | 338/22 R |
| 4,388,607 A | | 6/1983 | Toy et al. | 338/22 SD |
| 4,414,052 A | * | 11/1983 | Habata et al. | 29/611 |
| 4,426,633 A | | 1/1984 | Taylor | 228/25 |
| 4,444,608 A | | 4/1984 | Gale et al. | 264/105 |
| 4,454,379 A | | 6/1984 | Cleveland et al. | 174/107 |

(List continued on next page.)

FOREIGN PATENT DOCUMENTS

| | | | | |
|---|---|---|---|---|
| DE | 3707494 A | | 3/1988 | |
| EP | 0 460 790 A1 | | 12/1991 | |
| JP | H4-18681 | | 3/1982 | |
| JP | 62-113402 | | 5/1987 | |
| JP | 5-9921 | | 2/1993 | |
| JP | 5-275205 | * | 10/1993 | 29/612 |
| JP | 5-343203 | * | 12/1993 | 29/612 |
| WO | WO94/01876 | | 1/1994 | |

OTHER PUBLICATIONS

Inoue et al. translation.*

European Search Report for European Application No. 99201778 dated Nov. 24, 1999.

(List continued on next page.)

*Primary Examiner*—Karl D. Easthom

(57) ABSTRACT

An electrical resistive device in which an element composed of a conductive polymer is positioned in contact with the surface layer of one or more metal electrodes. The metal electrode contains a base layer which includes a first metal, an intermediate metal layer which includes a metal that is different from the first metal, and a surface layer which (i) includes a second metal, (ii) has a center line average roughness $\overline{R_a}$ of at least 1.3, and (iii) has a reflection density $R_d$ of at least 0.60. The conductive polymer composition preferably exhibits PTC behavior density requirements, which may be, for example, circuit protection devices or heaters, have improved thermal and electrical performance over devices prepared with electrodes which do not meet the center line average roughness and reflection density requirements.

17 Claims, 1 Drawing Sheet

U.S. PATENT DOCUMENTS

| | | | | | |
|---|---|---|---|---|---|
| 4,482,801 | A | * | 11/1984 | Habata et al. | 219/540 |
| 4,534,889 | A | | 8/1985 | van Konynenburg et al. | 252/511 |
| 4,545,926 | A | | 10/1985 | Fouts et al. | 252/511 |
| 4,560,498 | A | | 12/1985 | Horsma et al. | 252/511 |
| 4,591,700 | A | | 5/1986 | Sopory | 219/505 |
| 4,689,475 | A | | 8/1987 | Matthiesen | 219/553 |
| 4,724,417 | A | | 2/1988 | Au et al. | 338/22 R |
| 4,774,024 | A | | 9/1988 | Deep et al. | 252/511 |
| 4,800,253 | A | | 1/1989 | Kleiner et al. | 219/553 |
| 4,857,880 | A | | 8/1989 | Au et al. | 338/22 R |
| 4,861,966 | A | | 8/1989 | Matthiesen et al. | 219/205 |
| 4,907,340 | A | | 3/1990 | Fang et al. | 29/610.1 |
| 4,924,074 | A | | 5/1990 | Fang et al. | 219/548 |
| 4,935,156 | A | | 6/1990 | van Konynenburg et al. | 219/553 |
| 5,049,850 | A | | 9/1991 | Evans et al. | 338/22 R |
| 5,089,801 | A | | 2/1992 | Chan et al. | 338/22 R |
| 5,174,924 | A | | 12/1992 | Yamada et al. | 252/511 |
| 5,250,228 | A | | 10/1993 | Baigrie et al. | 252/511 |
| 5,289,155 | A | * | 2/1994 | Okumara et al. | 338/22 SD |
| 5,354,969 | A | * | 10/1994 | Akiyama et al. | 219/541 |
| 5,358,793 | A | * | 10/1994 | Hanada et al. | 428/560 |
| 5,382,938 | A | * | 1/1995 | Hansson et al. | 338/22 R |
| 5,874,885 | A | * | 2/1999 | Chandler et al. | 338/22 R |

OTHER PUBLICATIONS

Patent Abstracts of Japan, vol. 016, No. 154 (E–11907), Apr. 15, 1992 & abstract of JP 04–007802 (Daito Tsushinki KK.), Jan. 13, 1992.

International Search Report for International Application No. PCT/US95/07888, mailed Aug. 31, 1995.

Patent Abstracts of Japan, vol. 13, No. 168 (E–747), Apr. 21, 1989 (abstract of JP–A–64–001201 (Mueata Manufacturing Co. Ltd.)).

D.J. Arrowsmith, "Adhesion of Electroformed Copper and Nickel to Plastic Laminates", Transactions of the Institute of Metal Finishing, vol. 48, 1970, p. 88–92.

D.J. Arrowsmith, "Aspects of Adhesion", Product Finishing, vol. 24, No. 1, Jan. 1971, p. 40–47.

Donald M. Bigg, and E. Joseph Bradbury, "Conductive Polymeric Composites from Short Conductive Fibers", Conductive Polymers, Raymond B. Seymour, editor, Plenum Press, 1981, p. 23–38.

* cited by examiner

ELECTRICALLY RESISTIVE PTC DEVICES CONTAINING CONDUCTIVE POLYMERS

CROSS-REFERENCE TO RELATED APPLICATIONS

This application is a continuation application of commonly assigned application Ser. No. 08/672,496, filed Jun. 28, 1996, now abandoned, which is a continuation of commonly assigned application Ser. No. 08/255,584, filed Jun. 8, 1994, now abandoned. This application is also related to copending, commonly assigned application Ser. No. 08/750,294, filed Dec. 5, 1996, which is the national stage of commonly assigned International Application No. PCT/US95/07888, filed Jun. 7, 1995, which is a continuation-in-part of application Ser. No. 08/255,584, filed Jun. 8, 1994. The disclosure of each of these applications is incorporated herein by reference.

BACKGROUND OF THE INVENTION

1. Field of the Invention

This invention relates to electrical devices comprising conductive polymer compositions and to circuits comprising such devices.

2. Introduction to the Invention

Electrical devices comprising conductive polymer compositions are well-known. Such devices comprise an element composed of a conductive polymer. The element is physically and electrically connected to at least one electrode suitable for attachment to a source of electrical power. Those factors determining the type of electrode used include the specific application, the configuration of the device, the surface to which the device is to be attached, and the nature of the conductive polymer. Among those types of electrodes which have been used are solid and stranded wires, metal foils, perforated and expanded metal sheets, and conductive inks and paints. When the conductive polymer element is in the form of a sheet or laminar element, metal foil electrodes which are directly attached to the surface of the conductive polymer, sandwiching the element, are particularly preferred. Examples of such devices are found in U.S. Pat. No. 4,426,633 (Taylor), U.S. Pat. No. 4,689,475 (Matthiesen), U.S. Pat. No. 4,800,253 (Kleiner et al), U.S. Pat. No. 4,857,880 (Au et al), U.S. Pat. No. 4,907,340 (Fang et al), and U.S. Pat. No. 4,924,074 (Fang et al), the disclosures of which are incorporated herein by reference.

As disclosed in U.S. Pat. No. 4,689,475 (Matthiesen) and U.S. Pat. No. 4,800,253 (Kleiner et al), microrough metal foils having certain characteristics give excellent results when used as electrodes in contact with conductive polymers. Thus U.S. Pat. No. 4,689,475 discloses the use of metal foils which have surface irregularities, e.g. nodules, which protrude from the surface by 0.1 to 100 microns and have at least one dimension parallel to the surface which is at most 100 microns, and U.S. Pat. No. 4,800,253 discloses the use of metal foils with a microrough surface which comprises macronodules which themselves comprise micronodules. Other documents which disclose the use of metal foils having rough surfaces, but which do not disclose the characteristics of the foils disclosed in U.S. Pat. Nos. 4,689,475 and 4,800,253, are Japanese Patent Kokai No. 62-113402 (Murata, 1987), Japanese Patent Kokoku H4-18681 (Idemitsu Kosan, 1992), and German Patent Application No. 3707494A (Nippon Mektron Ltd). The disclosure of each of these U.S., Japanese, and German documents is incorporated herein by reference.

SUMMARY OF THE INVENTION

We have found that still better results for electrodes which are in contact with a conductive polymer can be obtained by using rough-surfaces metal foils having one or both of two characteristics which are not found in the metal foils which have been used, or proposed for use, in the past. These characteristics are (1) The protrusions from the surface of the foil should have a certain minimum average height (and preferably a certain maximum average height), as expressed by a value known as the "center line average roughness", whose measurement is described below. In addition, the protrusions from the surface of the foil have a certain minimum irregularity (or "structure"), as expressed by a value known as the "reflection density", whose measurement is also described below.

(2) The base of the foil comprises a first metal and the protrusions from the surface of the foil comprise a second metal. The first metal is selected to have high thermal and electrical conductivity, and is preferably easily manufactured at a relatively low cost. In addition, the first metal is often more likely to cause degradation of the conductive polymer than the second metal. Fracture of the protrusions, caused by thermal cycling of the device, and/or thermal diffusion of the metals at elevated temperature, exposes the second metal rather than the first metal.

Characteristic (1) is believed to be important because it ensures that the conductive polymer penetrates into the surface of the foil sufficiently to provide a good mechanical bond. However, if the height of the protrusions is too great, the polymer will not completely fill the crevices between the protrusions, leaving an air gap which will result in accelerated aging of the conductive polymer and/or more rapid corrosion of the polymer/metal interface surrounding the air gap. Characteristic (2) is based upon our discovery that thermal cycling of the device will cause fracture of some of the protrusions as a result of the different thermal expansion characteristics of the conductive polymer and the foil, so that it is important that such fracture does not expose the conductive polymer to a metal which will promote polymer degradation. In addition, it is important that a sufficient thickness of the second metal be in contact with the conductive polymer so that even if the first metal diffuses into the second metal at elevated temperature, there is little chance that the first metal will contact the conductive polymer.

In a first aspect, this invention discloses an electrical device which comprises

- (A) an element composed of a conductive polymer; and
- (B) at least one metal foil electrode which
  - (1) comprises
    - (a) a base layer which comprises a first metal,
    - (b) an intermediate metal layer which (i) is positioned between the base layer and a surface layer, and (ii) comprises a metal which is different from the first metal, and
    - (c) a surface layer which (i) comprises a second metal, (ii) has a center line average roughness $\overline{R_a}$ of at least 1.3, and (iii) has a reflection density $R_d$ of at least 0.60, and
  - (2) is positioned so that the surface layer is in direct physical contact with the conductive polymer element.

In a second aspect, this invention provides a circuit protection device which comprises

- (A) an element composed of a conductive polymer which exhibits PTC behavior; and
- (B) two metal foil electrodes positioned on opposite sides of the conductive polymer element, each of which electrodes comprises (1) a base layer which comprises copper, (2) an intermediate layer which (a) is adjacent to the base layer and (b) comprises nickel, and (3) a surface layer which (a) comprises nickel, (b) has a center line average roughness $\overline{R_a}$ of at least 1.3 and at most 2.5, (c) has a reflection density $R_d$ of at least 0.60, and (d) is in direct physical contact with the conductive polymer element.

In a third aspect, this invention provides an electrical circuit which comprises (A) a source of electrical power;

(B) a load; and (C) an electrical device, e.g. a circuit protection device, of the first aspect of the invention.

DETAILED DESCRIPTION OF THE INVENTION

Figure 1:
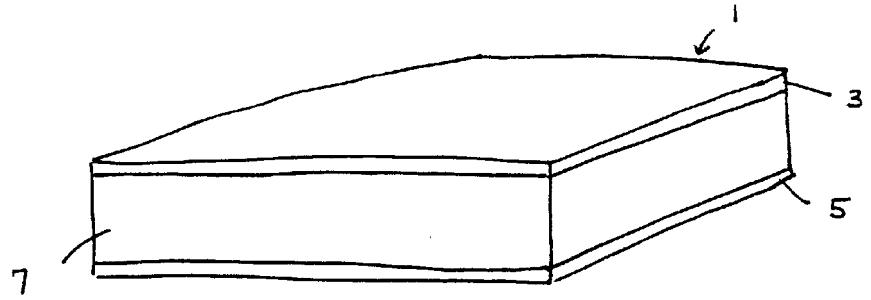
FIG. 1 shows a plan view of a device of the invention.

Electrical devices of the invention are prepared from an element composed of a conductive polymer composition. The conductive polymer composition is one in which a particulate conductive filler is dispersed or distributed in a polymeric component. The composition generally exhibits positive temperature coefficient (PTC) behavior, i.e. it shows a sharp increase in resistivity with temperature over a relatively small temperature range, although for some applications, the composition may exhibit zero temperature coefficient (ZTC) behavior. In this specification, the term "PTC" is used to mean a composition or device which has an $R_{14}$ value of at least 2.5 and/or an $R_{100}$ value of at least 10, and it is preferred that the composition or device should have an $R_{30}$ value of at least 6, where $R_{14}$ is the ratio of the resistivities at the end and the beginning of a 14° C. range, $R_{100}$ is the ratio of the resistivities at the end and the beginning of a 100° C. range, and $R_{30}$ is the ratio of the resistivities at the end and the beginning of a 30° C. range. Generally the compositions used in devices of the invention which exhibit PTC behavior show increases in resistivity which are much greater than those minimum values.

The polymeric component of the composition is preferably a crystalline organic polymer. Suitable crystalline polymers include polymers of one or more olefins, particularly polyethylene; copolymers of at least one olefin and at least one monomer copolymerisable therewith such as ethylene/acrylic acid, ethylene/ethyl acrylate, ethylene/vinyl acetate, and ethylene/butyl acrylate copolymers; melt-shapeable fluoropolymers such as polyvinylidene fluoride and ethylene/tetrafluoroethylene copolymers (including terpolymers); and blends of two or more such polymers. For some applications it may be desirable to blend one crystalline polymer with another polymer, e.g. an elastomer, an amorphous thermoplastic polymer, or another crystalline polymer, in order to achieve specific physical or thermal properties, e.g. flexibility or maximum exposure temperature. Electrical devices of the invention are particularly useful when the conductive polymer composition comprises a polyolefin because of the difficulty of bonding conventional metal foil electrodes to nonpolar polyolefins. For applications in which the composition is used in a circuit protection device, it is preferred that the crystalline polymer comprise polyethylene, particularly high density polyethylene, and/or an ethylene copolymer. The polymeric component generally comprises 40 to 90% by volume, preferably 45 to 80% by volume, especially 50 to 75% by volume of the total volume of the composition.

The particulate conductive filler which is dispersed in the polymeric component may be any suitable material, including carbon black, graphite, metal, metal oxide, conductive coated glass or ceramic beads, particulate conductive polymer, or a combination of these. The filler may be in the form of powder, beads, flakes, fibers, or any other suitable shape. The quantity of conductive filler needed is based on the required resistivity of the composition and the resistivity of the conductive filler itself. For many compositions the conductive filler comprises 10 to 60% by volume, preferably 20 to 55% by volume, especially 25 to 50% by volume of the total volume of the composition. When used for circuit protection devices, the conductive polymer composition has a resistivity at 20° C., $\rho_{20}$, of less than 10 ohm-cm, preferably less than 7 ohm-cm, particularly less than 5 ohm-cm, especially less than 3 ohm-cm, e.g. 0.005 to 2 ohm-cm. When the electrical device is a heater, the resistivity of the conductive polymer composition is preferably higher, e.g. $10^2$ to $10^5$ ohm-cm, preferably $10^2$ to $10^4$ ohm-cm.

The conductive polymer composition may comprise additional components, such as antioxidants, inert fillers, nonconductive fillers, radiation crosslinking agents (often referred to as prorads or crosslinking enhancers), stabilizers, dispersing agents, coupling agents, acid scavengers (e.g. $CaCO_3$), or other components. These components generally comprise at most 20% by volume of the total composition.

Dispersion of the conductive filler and other components may be achieved by melt-processing, solvent-mixing, or any other suitable means of mixing. Following mixing the composition can be melt-shaped by any suitable method to produce the element. Suitable methods include may be melt-extruding, injection-molding, compression-molding, and sintering. For many applications, it is desirable that the compound be extruded into sheet from which the element may be cut, diced, or otherwise removed. The element may be of any shape, e.g. rectangular, square, or circular. Depending on the intended end-use, the composition may undergo various processing techniques, e.g. crosslinking or heat-treatment, following shaping. Crosslinking can be accomplished by chemical means or by irradiation, e.g. using an electron beam or a $Co^{60}$ $\gamma$ irradiation source, and may be done either before or after the attachment of the electrode.

The conductive polymer element may comprise one or more layers of a conductive polymer composition. For some applications, e.g. where it is necessary to control the location at which a hotline or hotzone corresponding to a region of high current density forms, it is desirable to prepare the element from layers of conductive polymers which have different resistivity values. Alternatively, it may be beneficial to apply a conductive tie layer to the surface of the element to enhance bonding to the electrode.

Suitable conductive polymer compositions are disclosed in U.S. Pat. No. 4,237,441 (van Konynenburg et al), U.S. Pat. No. 4,388,607 (Toy et al), U.S. Pat. No. 4,534,889 (van Konynenburg et al), U.S. Pat. No. 4,545,926 (Fouts et al), U.S. Pat. No. 4,560,498 (Horsma et al), U.S. Pat. No. 4,591,700 (Sopory), U.S. Pat. No. 4,724,417 (Au et al), U.S. Pat. No. 4,774,024 (Deep et al), U.S. Pat. No. 4,935,156 (van Konynenburg et al), U.S. Pat. No. 5,049,850 (Evans et al), and U.S. Pat. No. 5,250,228 (Baigrie et al), and in pending U.S. application Ser. No. 07/894,119 (Chandler et al, filed Jun. 5, 1992), now U.S. Pat. No. 5,378,407 (issued Jan. 3, 1995), Ser. No. 08/085,859 (Chu et al, filed Jun. 29, 1993), now U.S. Pat. No. 5,451,919 (issued Sep. 19, 1995), Ser. No. 08/173,444 (Chandler et al, filed Dec. 23, 1993), and Ser. No. 08/255,497 (Chu et al, filed Jun. 8, 1995), now U.S. Pat. No. 5,582,770 (issued Dec. 10, 1996). The-disclosure of each of these patents and applications is incorporated herein by reference.

The devices of the invention comprise at least one electrode which is in direct physical contact with, generally bonded directly to, the conductive polymer element. For many devices of the invention, two electrodes are present, sandwiching the conductive polymer element. The electrode is generally in the form of a solid metal sheet, e.g. a foil, although for some applications, the electrode may be perforated, e.g. contain holes or slits. The electrode comprises at least two layers, i.e. a base layer which comprises a first metal, and a surface layer which comprises a second metal. In addition, as discussed below, one or more intermediate metal layers may be present, each of which is positioned between the base layer and the surface layer.

The first metal, used in the base layer, may be any suitable material, e.g. nickel, copper, aluminum, brass, or zinc, but is most often copper. Copper is preferred because of its excellent thermal and electrical conductivity which allows uniform distribution of electrical current across a device, the reproducibility of its production process, the ease of its manufacture which allows production of defect-free continuous lengths, and its relatively low cost. The surface of the base layer may be relatively smooth or may be microrough. Microrough surfaces generally are those which have irregularities or nodules which protrude from the surface by a distance of at least 0.03 microns, preferably at least 0.1 microns, particularly 0.1 to 100 microns, and which have at least one dimension parallel to the surface which is at most 500 microns, preferably at most 100 microns, particularly at most 10 microns, and which is preferably at least 0.03 micron, particularly at least 0.1 micron. Each irregularity or nodule may be composed of smaller nodules, e.g. in the form of a bunch of grapes. Such microroughness is often produced by electrodeposition in which a metal foil is exposed to an electrolyte, but a microrough surface may also be achieved by removing material from a smooth surface, e.g. by etching; by chemical reaction with a smooth surface, e.g. by galvanic deposition; or by contacting a smooth surface with a patterned surface, e.g. by rolling, pressing, or embossing. In general, a foil is said to have a smooth surface if its center line average roughness $\overline{R_a}$ is less than 1.0, and a microrough surface if $\overline{R_a}$ is greater than 1.0. It is often preferred that the surface of the base layer in contact with the intermediate layer have an $\overline{R_a}$ value of less than 1.0, preferably less than 0.9, particularly less than 0.8, especially less than 0.7. Metal foils with such a smooth surface generally are difficult to bond to conductive polymer compositions, especially if the conductive polymer composition has a high level of filler and/or comprises a non-polar polymer. $\overline{R_a}$ is defined as the arithmetic average deviation of the absolute values of the roughness profile from the mean line or center line of a surface when measured using a profilometer having a stylus with a 5 micron radius. The value of the center line is such that the sum of all areas of the profile above the center line is equal to the sum of all areas below the center line, when viewed at right angles to the foil. Appropriate measurements can be made by using a Tencor P-2 profilometer, available from Tencor. Thus $\overline{R_a}$ is a gauge of the height of protrusions from the surface of the foil.

The surface layer is either in direct physical contact with the base layer or, preferably, is separated from the base layer by one or more intermediate conductive, preferably metal, layers. The surface layer comprises a second metal which is different from the first metal. Appropriate second metals include nickel, copper, brass, or zinc, but for many devices of the invention the second metal is most often nickel or a nickel-containing material, e.g. zinc-nickel. Nickel is preferred because it provides a diffusion barrier for a copper base layer, thus minimizing the rate at which copper comes in contact with the polymer and serves to degrade the polymer. Furthermore, a nickel surface layer will naturally comprise a thin nickel oxide covering layer which is stable to moisture. The surface layer is in direct physical contact with the conductive polymer element. To enhance adhesion to the conductive polymer element, the surface layer has a microrough surface, i.e. has a center line average roughness $\overline{R_a}$ of at least 1.3, preferably at least 1.4, particularly at least 1.5. Although it is desirable that the protrusions from the surface are high enough to allow adequate penetration of the polymer into the gaps to produce a good mechanical bond, it is not desirable that the height of the protrusions be so great that polymer is unable to fill the gap completely. Such an air gap results in poor aging performance when a device is exposed to elevated temperature or to applied voltage. Therefore, it is preferred that $\overline{R_a}$ be at most 2.5, preferably at most 2.2, particularly at most 2.0.

We have found that in addition to the required $\overline{R_a}$, the surface layer must also have a particular reflection density $R_d$. Reflection density is defined as log (1/% reflected light) when light over the visible range (i.e. 200 to 700 nm) is directed at the surface. An average of measurements each taken over an area of 4 $mm^2$ is calculated. Appropriate measurements can be made using a Macbeth Model 1130 Color Checker in the automatic filter selection mode "L" with calibration of a black standard to 1.61 prior to the measurement. For a surface with perfect reflection, the value of $R_d$ is 0; the value increases as the amount of light absorbed increases. Higher values indicate greater structure in the protrusions from the surface. For devices of the invention, the value of $R_d$ is at least 0.60, preferably at least 0.65, particularly at least 0.70, especially at least 0.75, most especially at least 0.80.

When, as is preferred, an intermediate layer is present, it may comprise the second metal or a third metal. The metal in the intermediate layer may not be the same as the first metal. It is preferred that the intermediate layer comprise the second metal. In a preferred embodiment, the intermediate layer comprises a generally smooth layer attached to the base layer. The intermediate layer then serves as a basis from which a microrough surface layer can be prepared. For example, if the base layer is copper, the intermediate layer may be a generally smooth layer of nickel from which nickel nodules can be produced on electrodeposition to provide a surface layer.

The metal electrodes may be attached to the conductive polymer element by any suitable means, e.g. compression molding or nip lamination. Depending on the viscosity of the conductive polymer and the lamination conditions, different types and thicknesses of metal foils may be suitable. To provide adequate flexibility and adhesion, it is preferred that the metal foil have a thickness of less than 50 microns (0.002 inch), particularly less than 44 microns (0.00175 inch), especially less than 38 microns (0.0015 inch), most especially less than 32 microns (0.00125 inch). In general, the thickness of the base layer is 10 to 45 microns (0.0004 to 0.0018 inch), preferably 10 to 40 microns (0.0004 to 0.0017 inch). The thickness of the surface layer is generally 0.5 to 20 microns (0.00002 to 0.0008 inch), preferably 0.5 to 15 microns (0.00002 to 0.0006 inch), particularly 0.7 to 10 microns (0.00003 to 0.0004 inch). If an intermediate layer is present, it generally has a thickness of 0.5 to 20 microns (0.00002 to 0.0008 inch), preferably 0.8 to 15 microns (0.00003 to 0.0006 inch). When the layer comprises a microrough surface, the term "thickness" is used to refer to the average height of the nodules.

One measurement of the adequacy of attachment of the metal electrode to the conductive polymer composition is by peel strength. Peel strength, as described below, is measured by clamping one end of a sample in the jaw of a testing apparatus and then peeling the foil, at a constant rate of 127 mm/minute (5 inches/minute) and at an angle of 90°, i.e. perpendicular to the surface of the sample. The amount of force in pounds/linear inch required to remove the foil from the conductive polymer is recorded. It is preferred that the electrode have-a peel strength of at least 3.0 pli, preferably at least 3.5 phi, particularly at least 4.0 pli, when attached to the conductive polymer composition.

The electrical devices of the invention may comprise circuit protection devices, heaters, sensors, or resistors. Circuit protection devices generally have a resistance of less than 100 ohms, preferably less than 50 ohms, particularly less than 30 ohms, especially less than 20 ohms, most especially less than 10 ohms. For many applications, the resistance of the circuit protection device is less than 1 ohm, e.g. 0.010 to 0.500 ohms. Heaters generally have a resistance of at least 100 ohms, preferably at least 250 ohms, particularly at least 500 ohms.

Electrical devices of the invention are often used in an electrical circuit which comprises a source of electrical power, a load, e.g. one or more resistors, and the device. In order to connect an electrical device of the invention to the other components in the circuit, it may be necessary to attach one or more additional metal leads, e.g. in the form of wires or straps, to the metal foil electrodes. In addition, elements to control the thermal output of the device, i.e. one or more conductive terminals, can be used. These terminals can be in the form of metal plates, e.g. steel, copper, or brass, or fins, which are attached either directly or by means of an intermediate layer such as solder or a conductive adhesive, to the electrodes. See, for example, U.S. Pat. No. 5,089,801 (Chan et al), and in pending U.S. application Ser. No. 07/837,527 (Chan et al), filed Feb. 18, 1992, now abandoned in favor of U.S. application Ser. No. 08/087,017, filed Jul. 6, 1993, now U.S. Pat. No. 5,436,609 (issued Jul. 25, 1995). For some applications, it is preferred to attach the devices directly a circuit board. Examples of such attachment techniques are shown in U.S. application Ser. No. 07/910,950 (Graves et al, filed Jul. 9, 1992), Ser. No. 08/121,717 (Siden et al, filed Sep. 15, 1993), both of which have been abandoned and the subject matter of which is pending in U.S. application Ser. No. 08/900,787, filed Jul. 25, 1998) and Ser. No. 08/242,916 (Zhang et al, filed May 13, 1994, abandoned in favor of U.S. application Ser. No. 08/710,925, filed Sep. 24, 1996, now U.S. Pat. No. 5,831,510 (issued Nov. 3, 1998), and in International Application No. PCT/US93/06480 (Raychem Corporation, filed Jul. 8, 1993). The disclosure of each of these patents and applications is incorporated herein by reference.

The invention is illustrated by the drawing in which FIG. 1 shows a plan view of electrical device 1 of the invention in which metal foil electrodes 3,5 are attached directly to a PTC conductive polymer element 7. Element 7 may comprise a single layer, as shown, or two or more layers of the same or different compositions.

Figure 2:
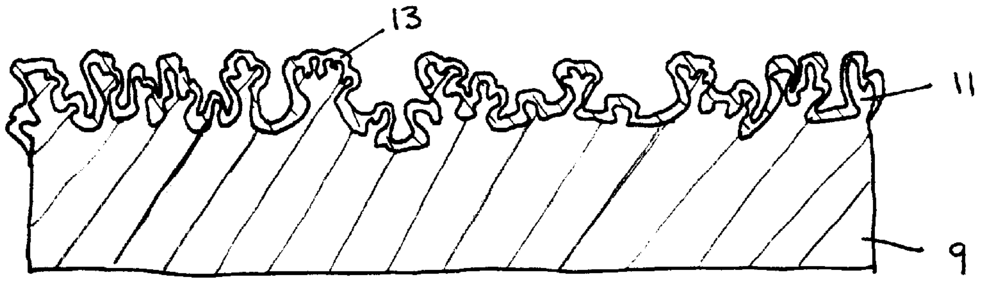
FIG. 2 shows a cross-sectional schematic view of a conventional metal foil.

FIG. 2 shows a schematic cross-sectional view of a conventional metal foil to be used as an electrode 3,5. A base layer 9 comprising a first metal, e.g. copper, has a microrough surface produced preferably by electrodeposition. The nodules 11 comprising the microrough surface are composed of the first metal. A surface layer 13 of a second metal, e.g. nickel, covers the nodules 11.

Figure 3:
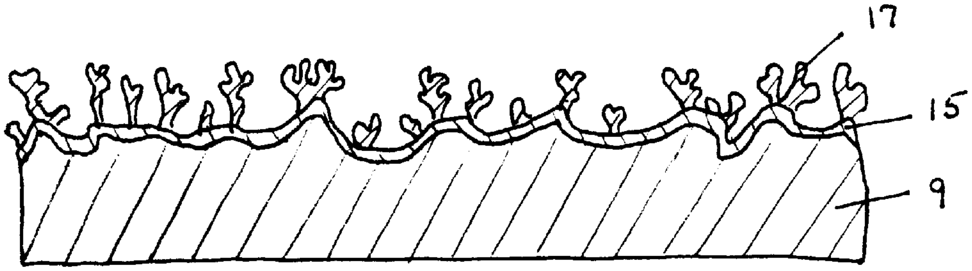
FIG. 3 shows a cross-sectional schematic view of a metal foil used in devices of the invention.

FIG. 3 shows a schematic cross-sectional view of a metal foil used as an electrode 3,5 in devices of the invention. A base layer 9 comprising a first metal, e.g. copper, is in contact with an intermediate layer 15 comprising a second metal, e.g. nickel. The surface of the intermediate layer forms the base for a surface layer 17 which has a microrough surface. As shown in FIG. 3, the nodules comprising surface layer 17 are formed of the second metal.

The invention is illustrated by the following Examples 1 to 9 in which Examples 1, 2, 4, 7 and 8 are comparative examples.

Composition

For each of compositions A and B, the ingredients listed in Table I were preblended in a Henschel blender and then mixed in a Buss-Condux kneader. The compound was pelletized and extruded through a sheet die to give a sheet with dimensions of approximately 0.30 m×0.25 mm (12×0.010 inch).

TABLE I

| | | Compositions in Weight Percent | |
|---|---|---|---|
| Ingredient | Tradename/Supplier | A | B |
| High density polyethylene | Petrothene ™ LB832/Quantum | 22.1% | 22.1% |
| Ethylene/acrylic acid copolymer | Primacor ™ 1320/Dow | 27.6 | |
| Ethylene/butyl acrylate copolymer | Enathene ™ EA 705/Quantum | | 27.6 |
| Carbon black | Raven ™ 430/Columbian | 50.3 | 50.3 |

Foil Type

The characteristics of the metal foils used in the Examples are shown in Table II. Each metal foil was approximately 35 microns thick.

TABLE II

| | Metal Foil Characteristics | | | | |
|---|---|---|---|---|---|
| Foil Type | 1 | 2 | 3 | 4 | 5 |
| Name | | N2PO | Type 31 | Type 28 | Type 31 |
| Lot number | — | — | 3 × 291 | — | 35191-2 |
| Supplier | Fukuda | Gould | Fukuda | Fukuda | Fukuda |
| Base Layer | Ni | Cu | Cu | Cu | Cu |
| Intermediate Layer | — | Cu | Ni | Ni | Ni |
| Surface Layer | Ni | Ni | Ni | Ni | Ni |
| Nodule Type | Ni | Cu | Ni | Ni | Ni |
| $R_a$ | — | 2.0 | 1.6 | 1.25 | 1.9 |
| $R_d$ | — | 0.65 | 0.90 | 0.76 | 0.81 |

Device Preparation

The extruded sheet was laminated to the metal foil either by compression-molding (C) in a press or by nip-lamination (N). In the compression-molding process, the extruded sheet was cut into pieces with dimensions of 0.30×0.41 m (12×16 inch) and was sandwiched between two pieces of foil. Pressure absorbing silicone sheets were positioned over the foil and the foil was attached by heating in the press at 175° C. for 5.5 minutes at 188 psi and cooling at 25° C. for 6 minutes at 188 psi to form a plaque. In the nip-lamination procedure, the extruded sheet was laminated between two foil layers at a set temperature of 177 to 198° C. (350 to 390° F.). The laminate was cut into plaques with dimensions of 0.30×0.41 m (12×16 inch). Plaques made by both processes were irradiated to 10 Mrad using a 3.5 MeV electron beam. Individual devices were cut from the irradiated plaques. For the trip endurance and cycle life tests, the devices were circular disks with an outer diameter of 13.6 mm (0.537 inch) and an inner diameter of 4.4 mm (0.172 inch). For the humidity test, the devices had dimensions of 12.7×12.7 mm (0.5×0.5 inch). Each device was temperature cycled from −40 to +80° C. six times, holding the device at each temperature for 30 minutes.

Trip Endurance Test

Devices were tested for trip endurance by using a circuit consisting of the device in series with a switch, a 15 volt DC power source, and a fixed resistor which limited the initial current to 40A. The initial resistance of the device at 25° C., $R_i$, was measured. The device was inserted in the circuit, was tripped, and then was maintained in its tripped state for the specified time period. Periodically, the devices were removed from the circuit and cooled to 25° C., and the final resistance at 25° C., $R_f$, was measured.

Cycle Life Test

Devices were tested for cycle life by using a circuit consisting of the device in series with a switch, a 15 volt DC power source, and a fixed resistor which limited the initial current to 50A. Prior to testing, the resistance at 25° C., $R_i$, was measured. The test consisted of a series of test cycles. Each cycle consisted of closing the switch for 3 seconds, thus tripping the device, and then opening the switch and allowing the device to cool for 60 seconds. The final resistance $R_f$ was recorded after each cycle.

Humidity Testing

After measuring the initial resistance $R_i$ at 25° C., devices were inserted into an oven maintained at 85° C. and 85% humidity. Periodically, the devices were removed from the oven, cooled to 25° C., and the final resistance $R_f$ was measured. The ratio of $R_f/R_i$ was then determined.

Peel Strength

The peel strength was measured by cutting samples with dimensions of 25.4×254 mm (1×10 inch) from extruded sheet attached to metal foil. One end of the sample was clamped into an Tinius Olsen tester. At the other end, the foil was peeled away from the conductive polymer at an angle of 90° and a rate of 127 mm/minute (5 inches/minute). The amount of force in pounds/linear inch required to remove the foil from the conductive polymer was recorded.

TABLE III

| | Example | | | | | | |
|---|---|---|---|---|---|---|---|
| | 1 | 2 | 3 | 4 | 5 | 6 | 7 |
| Composition | A | A | A | A | B | B | B |
| Foil Type | 1 | 2 | 3 | 4 | 5 | 3 | 2 |
| Preparation | C | C | N | C | N | N | N |
| Peel (pli) | | | | | 5 | | 3 |
| Trip Endurance ($R_f/R_i$ after hours at 15 VDC) | | | | | | | |
| 24 | 3.75 | | | | 2.41 | | 1.90 |
| 48 | 4.45 | | | | 2.65 | | 1.76 |
| 112 | | | 5.2 | | | 2.68 | |
| 500 | | | 23.7 | | | 3.71 | |

TABLE III-continued

| | Example | | | | | | |
|---|---|---|---|---|---|---|---|
| | 1 | 2 | 3 | 4 | 5 | 6 | 7 |
| Cycle Life ($R_f/R_i$ after cycles at 15 VDC/50 A) | | | | | | | |
| 500 | 1.69 | | 1.41 | | 1.77 | 1.34 | 1.54 |
| 1000 | 1.92 | | 1.62 | | 2.25 | 1.65 | 1.75 |
| 1500 | | | | | | | |
| 2500 | | | | | | | |
| Humidity ($R_f/R_i$ after hours at 85° C./85%)* | | | | | | | |
| 500 | | 1.05 | 1.02 | | | 1.14 | 0.94 |
| 700 | | | | 1.82 | | | |
| 1000 | 0.91 | 1.30 | 1.03 | | 1.54 | 1.19 | 0.95 |
| 1100 | | | | 3.74 | | | |
| 2000 | | 2.65 | | | | | |
| 2500 | 1.04 | | | | 1.86 | | 0.94 |

*Example 2 was tested at 85° C./90% humidity.

EXAMPLES 8 and 9

Following the above procedures and using a nip/lamination process at 185° C., devices were prepared from a composition comprising 28.5% by weight Enathene EA 705 ethylene/butyl acrylate copolymer, 23.4% by weight Petrothene LB832 high density polyethylene, and 48.1% by weight Raven 430 carbon black. Devices were tested as described above for trip endurance, cycle life, and humidity. Additional testing was conducted following cycle testing to 3500 cycles and storage at room temperature (25° C.) for approximately three months. Ten devices of each type which had been cycled 3500 cycles at 15 VDC and 40A were aged in a circulating air oven at 100° C. for 600 hours or at 85° C./85% humidity for 600 hours. Periodically the devices were cooled to 25° C. and their resistances were measured. Devices of the invention (Example 9) in which the nodules were nickel showed better aging behavior than devices prepared with conventional metal foil electrodes in which the nodules were copper (Example 8). Results are shown in Table IV. One metal electrode from one device from each of Examples 8 and 9 which had been aged at 100° C. for 170 hours was peeled off the polymeric element and the surface which had been in contact with the conductive polymer composition was analyzed by ESCA to determine elemental composition of the surface (i.e. the top 10 nm). The average of the measurements for two different regions of the surface is shown in Table V. As a control, samples of the metal foil used to prepare the electrode were aged in air for 24 hours at 200° C. to simulate the thermal exposure of the foil during processing and testing. The results are shown in Table V. The limit of detection of the equipment was 0.1 atomic percent.

TABLE IV

| Example | 8 | 9 |
|---|---|---|
| Foil Type | 2 | 3 |
| Peel (pli) | 1.8–3.0 | 4.0–5.0 |
| Trip Endurance ($R_f/R_i$ after hours at 15 VDC) | | |
| 28 | 1.86 | 1.74 |
| 195 | 2.65 | 2.56 |
| 1128 | 7.61 | 6.40 |
| Cycle Life ($R_f/R_i$ after cycles at 15 VDC/50 A) | | |
| 1500 | 1.66 | 1.45 |
| 2500 | 2.38 | 1.82 |
| 3500 | 2.70 | 1.14 |

TABLE IV-continued

| Example | 8 | 9 |
|---|---|---|
| Aging data after 3500 cycles/3 months at 25° C. ($R_f/R_i$ after hours at 100° C.) | | |
| 24 | 1.06 | 0.87 |
| 72 | 1.20 | 0.91 |
| 120 | 1.19 | 0.90 |
| 600 | 1.32 | 1.03 |
| Humidity ($R_f/R_i$ after hours at 85° C./85%) | | |
| 500 | 0.92 | 0. 92 |
| Humidity data after 3500 cycles/3 months at 25° C. ($R_f/R_i$ after hours at 85° C./85%) | | |
| 24 | 0.89 | 0.81 |
| 72 | 0.92 | 0.79 |
| 120 | 0.91 | 0.75 |
| 600 | 1.26 | 0.82 |

TABLE V

Results of ESCA Testing

| Example | Foil Type | Atomic Percent of Elements C | O | Ni | Cu | Other Element |
|---|---|---|---|---|---|---|
| Foil from 8 | 2 | 85.5 | 11.0 | 0.3 | 0.4 | 2.8 |
| Foil from 9 | 3 | 92.0 | 5.5 | 0.4 | * | 2.1 |
| Bare Foil | 2 | 34.5 | 40.0 | 16.5 | 2.5 | 6.5 |
| Bare Foil | 3 | 28.0 | 46.0 | 22.0 | * | 4.0 |

*less than 0.1 atomic %

What is claimed is:

1. An electrical device which comprises (A) an element composed of a conductive polymer which exhibits PTC behavior; and (B) at least one metal foil electrode which (1) comprises a base layer, a surface layer, and an intermediate layer which is positioned between the base layer and the surface layer, (a) the base layer comprising a first metal, (b) the intermediate metal layer comprising a metal which is different from the first metal, and (c) the surface layer (i) consisting essentially of a second metal, (ii) having a center line average roughness $\overline{R_a}$ of at least 1.4, and (iii) having a reflection density $R_d$ of at least 0.70, and (2) is positioned so that the surface layer is in direct physical contact with the conductive polymer element.

2. A device according to claim 1 which comprises two metal foil electrodes.

3. A device according to claim 1 wherein the first metal is copper or brass.

4. A device according to claim 1 wherein the second metal is nickel.

5. A device according to claim 1 wherein the metal in the intermediate layer is the same as the metal in the surface layer.

6. A device according to claim 1 wherein the intermediate layer is nickel.

7. A device according to claim 1 wherein $\overline{R_a}$ is at most 2.5.

8. A device according to claim 1 wherein the base layer has a surface which has a center line average roughness $\overline{R_a}$ of less than 1.0, and contacts the intermediate layer.

9. A device according to claim 1 wherein the conductive polymer composition comprises a polyolefin, and dispersed therein, a particulate conductive filler.

10. A device according to claim 1 which is a circuit protection device and has a resistance of less than 50 ohms.

11. A device according to claim 1 which is a heater and has a resistance of at least 100 ohms.

12. A device according to claim 1 wherein the surface layer is composed of nodules, each of which is composed of a number of smaller nodules.

13. A circuit protection device which comprises (A) an element composed of a conductive polymer which exhibits PTC behavior; and (B) two metal foil electrodes positioned on opposite sides of the conductive polymer element, each of which electrodes comprises (1) a base layer which comprises copper, (2) an intermediate layer which (a) is adjacent to the base layer and (b) comprises nickel, and (3) a surface layer which consists essentially of nickel, has a center line average roughness $\overline{R_a}$ of at least 1.4 and at most 2.5, has a reflection density $R_d$ of at least 0.70, and is in direct physical contact with the conductive polymer element.

14. A device according to claim 13 wherein the conductive polymer composition comprises a polymeric component which comprises a polyolefin or a fluoropolymer.

15. A device according to claim 12 which has a resistance of less than 20 ohms.

16. A device according to claim 15 which has a resistance of less than 1 ohm.

17. An electrical circuit which comprises (A) a source of electrical power;

(B) a load; and (C) a circuit protection device which comprises (1) an element composed of a conductive polymer which (a) exhibits PTC behavior, and (b) comprises a polymeric component and dispersed therein a particulate conductive filler; and (2) at least one metal foil electrode which (a) comprises a base layer, a surface layer, and an intermediate layer which is positioned between the base layer and the surface layer, wherein (i) the base layer comprises a first metal, (ii) the intermediate metal layer comprises a metal which is different from the first metal, and (iii) the surface layer consists essentially of a second metal, has a center line average roughness $\overline{R_a}$ of at least 1.4, and has a reflection density $R_d$ of at least 0.70, and (b) is positioned so that the surface layer is in direct physical contact with the conductive polymer element.

* * * * *